United States Patent [19]

McClean

[11] Patent Number: 4,462,861

[45] Date of Patent: Jul. 31, 1984

[54] ETCHANT WITH INCREASED ETCH RATE

[75] Inventor: June L. McClean, Hudson, N.H.

[73] Assignee: Shipley Company Inc., Newton, Mass.

[21] Appl. No.: 551,037

[22] Filed: Nov. 14, 1983

[51] Int. Cl.³ .......................... C23F 1/02; B44C 1/22; C03C 15/00; C03C 25/06
[52] U.S. Cl. ................................ 156/640; 156/659.1; 156/666; 252/79.4
[58] Field of Search .................... 252/79.2, 79.4, 142; 156/640, 659.1, 666; 134/3, 41

[56] References Cited

U.S. PATENT DOCUMENTS 3,537,895 11/1970 Lancy .............................. 252/79.2 X
4,040,863 8/1977 Kitamura ........................ 156/666 X

FOREIGN PATENT DOCUMENTS 47-22336 10/1972 Japan ................................... 252/79.4

*Primary Examiner*—William A. Powell
*Attorney, Agent, or Firm*—Dike, Bronstein, Roberts, Cushman & Pfund

[57] ABSTRACT

A process for etching copper comprising contact of the copper with an etchant that is an aqueous solution of sulfuric acid, a peroxide and a low molecular weight carboxylic acid. The low molecular weight carboxylic acid in the etchant exalts etch rate.

27 Claims, No Drawings

ETCHANT WITH INCREASED ETCH RATE

BACKGROUND OF THE INVENTION

1. Introduction

This invention relates to an etchant comprising sulfuric acid activated with hydrogen peroxide and characterized by an enhanced etch rate. The etchant is particularly useful in the manufacture of printing circuit boards.

2. Description of the Prior Art

The activation of relatively dilute mineral acids with an oxygen release compound is known in the art and described, for example, in *Plating* "Surface Treatment of Metals with Peroxygen compounds", Vol. 42, p. 561 (1955). In the Plating publication, it is taught that mineral acids such as sulfuric acid, nitric acid, acetic acid and phosphoric acid may be activated with oxygen release compounds such as hydrogen peroxides or other peroxy, persulfate or perborate compounds. The oxygen release compounds enhance the etch rate thereby permitting a decrease in the concentration of the acid.

Activation of dilute sulfuric acid with hydrogen peroxide is most attractive due to low cost and ease of electrolytic copper recovery from the spent etchant prior to disposal. However, the utility of hydrogen peroxide etching solutions is reduced somewhat due to catalyzed decomposition of hydrogen peroxide caused by etched metal ions or other transition metal ions in solution and a slow etch rate, typically 1.4 mils of copper from 1 ounce copper clad laminate in 10–25 minutes at 120° F. To enhance or exalt etch rate, more concentrated solutions of hydrogen peroxide have been used, but concentrated peroxide solutions are hazardous to health and safety. In addition, such etchants have not been successfully used with tin dissimilar metal etch resists because they attack tin, especially immersion tin.

In U.S. Pat. No. 4,130,454, incorporated herein by reference, a modified peroxide etch is disclosed and claimed. The etchant comprises hydrogen peroxide and a molybdenum compound in an acidic solution. The hydrogen peroxide provides a sustained etch rate and the molybdenum etches at a substantially greater rate than the peroxide thereby exalting the rate to a desired level for commercial use. Molybdenum cannot be used as a sole oxidant because it is rapidly depleted due to reduction to a lower valence form as etching proceeds. It is therefore incapable of providing sustained etching. Patentee proposes a theory that the combination of peroxide and molybdenum is a synergistic combination because both are believed to etch the peroxide in the acid environment while providing the secondary function of oxidizing molybdenum to a higher valence capable of etching metals in the acidified environment.

The peroxide etchants described above are used to etch copper both by immersion and by spraying. Immersion etching comprises immersing a part within the etchant until the desired amount of metal is dissolved. Spray etching comprises spraying a finely divided stream of etchant against the surface of the part until the desired amount of metal is dissolved. Spray etching generally provides the advantage of a more rapid etch rate because the finely divided droplets of etchant are aerated resulting in additional oxygen at the surface of the part being etched and a concommitant increase in etch rate.

The etchants of the aforesaid U.S. Pat. No. 4,130,454 do provide the exalted etch rate as reported in the patent for immersion etching. However, for spray etching, the etch rate appears to be retarded rather than exalted which is contrary to that which would be expected. Consequently, the etchant of said patent is usable for spray etching, but spray etching of said etchant may not be commercially practical where high through put of parts is required.

SUMMARY OF THE INVENTION

The invention described herein is a peroxide etchant especially useful for rapidly dissolving large quantities of copper containing metals—i.e., copper and its alloys. The etchant is characterized by an exalted etch rate when used in both the immersion and spray modes. For immersion etching, the etchant of the invention has an etch rate comparable to the etchants of the aforesaid patent utilizing molybdenum as the exaltant and are able to dissolve all of the copper from a one ounce copper clad circuit board base material in from about 6 to 8 minutes, dependent upon the specific formulation used. For spray etching, the etchants are capable of dissolving all of the copper from one ounce copper clad base material in about 1.5 to 3 minutes compared to from about 10 to 15 minutes for those etchants using molybdenum as the exaltant.

In accordance with the invention, increased etch rate is achieved by the addition of a low molecular weight carboxylic acid to a peroxide etchant in sufficient quantity to increase the etch rate to the desired level. The carboxylic acid provides a secondary advantage of stabilizing the etchant against peroxide decomposition.

The etchants of the invention are used primarily as a final etch to dissolve large quantities of copper such as in chemical milling and printed circuit board manufacture.

DESCRIPTION OF THE PREFERRED EMBODIMENTS

For purposes of definition herein, the term etchant is used in its art recognized sense as a solution to remove substantial quantities of metal from a metal surface (description from The Language of Printed Circuits, PC FAB, July, 1982, Pg. 60) as contrasted to a pickling solution that is used to remove contaminants from the surface of a metal such as oxides and scales (description from Finishing Handbook and Directory 1979, edited by Capp, Sawell Publications Ltd., London, P. 891).

Though acids other than sulfuric acid may be used as a source of acidity for the etchants of the invention, sulfuric acid is preferred because it is the most economical, provides best results and yields copper sulfate upon saturation which is readily recovered by lowering the temperature of the etchant. Other acids may be used in admixture with the sulfuric acid for specific results. Therefore, the term sulfuric acid as used herein means sulfuric acid alone or mixed with other acids in lesser amounts where desired.

The concentration of the acid in the etchant may vary within broad limits but preferably, the acid content of the etchant is relatively low varying between about 0.1 and 2.5 Normal and preferably between about 0.5 and 1.5 Normal.

The peroxide content of the etchant may also vary within relatively broad limits such as from 0.1 to 10 moles per liter of solution. However, because peroxide is a relatively dangerous material to handle, its concentration is preferably maintained relatively low and preferably within the range of between about 0.5 and 2.5 moles per liter. As the peroxide content drops below 0.3 moles per liter, the etch rate begins to decrease.

The exaltant is a low molecular carboxylic acid conforming to the following general formula:

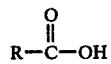

where R is hydrogen or a lower alkyl group having from 1 to 6 carbon atoms. Examples of suitable acids include acetic acid, propionic acid and butyric acid. Of the carboxlic acids encompassed by the above formula, propionic acid is preferred.

The concentration of the carboxylic acid can vary within broad limits. In all cases, the amount is sufficient to exalt the rate, preferably to a rate double the rate of etch absent the acid. This amount can vary from 0.1 to 2.0 moles per liter of etchant and amounts of from about 0.3 to 1 mole per liter are preferred.

Peroxide etchants are typically stabilized to prevent catalytic decomposition of the peroxide caused by metal impurities. The exaltants of the invention function as stabilizers. If desired, other stabilizers known to the art may be added such as the ayrlsulfonic acids or salts thereof as disclosed in U.S. Pat. No. 3,801,512. In this patent, a preferred stabilizer is phenol sulfonic acid. Other stabilizers include sulfosalicylic acid and toluene sulfonic acid. The concentration of the stabilizer, if used, may vary from as low as 1 gram per liter of solution to the solubility limit of the acid, but preferably varies between about 3 and 30 grams per liter of solution.

Another additive that may be added to the etchant of the invention is a source of phosphate ions used as an inhibitor to prevent attack on tin, especially immersion tin, as well as several other metals such as nickel and alloys of nickel such as gold alloys. The use of phosphate ions as an inhibitor in such etchants is disclosed in U.S. Pat. No. 4,144,119. The concentration of the phosphate ion in the etchant is not critical, minor amounts inhibiting attack on tin to some degree and larger amounts providing greater protection. This amount may vary between about 0.1 and 2.5 moles per liter (as phosphate) and more preferably, between about 0.25 and 1.5 moles per liter, all as taught in the aforesaid patent.

Using the etchants of this invention to etch copper at 120° F., the bath will dissolve from about 70 to 80 grams of copper per liter assuming the hydrogen peroxide concentration is maintained between 50 and 100% of its initial makeup. Allowing the bath to cool to room temperature induces crystallization of copper compounds which may be recovered by filtration dependent upon the acid used. When sulfuric acid is used as the source of acidity, relative pure copper sulfate crystals may be recovered. Readjustment in the concentration of the components comprising the etch solution makes the same suitable for re-use.

The etchants of the invention are used for the same purposes as similar etchants of the prior art. They are particularly used for the manufacture of printed circuit boards and for chemical milling. Procedures for the formation of printed circuit boards are described in numerous publications, for example, in Coombs, *Printed Circuits Handbook*, McGraw-Hill Publishing Company, New York, 1967, Chapter 5, incorporated herein by reference.

In a typical process for the manufacture of a printed circuit board, a suitable base material is selected such as copper clad epoxy. Holes are drilled at appropriate locations on the board and the walls of the holes are metallized with copper to provide electrical contact between the two surfaces of the base material. Methods for metallization are known and include the steps of cleaning, catalyzing and electroless copper deposition.

Following metallization of the holes, utilizing a process known as pattern plating, a conductor pattern is formed on the copper by application of an organic resist material which may be either a photoresist or a screen resist, dependent upon the design and definition of the board. The resist coats the copper that is not part of the conductor pattern and leaves the copper bare in a conductor pattern. Thickness of the copper pattern is then increased by electrolytic copper plating. Following copper plating, a dissimilar metal etch resist such as solder may be applied over the copper in the conductor pattern to protect the same from subsequently applied etchants, the organic resist is removed exposing the unwanted copper (not part of the conductor pattern), and the unwanted copper is dissolved with a suitable etchant for the copper such as that disclosed herein while the conductor pattern is protected from the etchant by the dissimilar metal etch resist. Typically, the dissimilar metal etch resist is selected not only for its ability to withstand the etchant, but also for its solderability so that electrical connections can be soldered directly to the etch resist.

The invention will be better understood by reference to the following examples:

EXAMPLES 1 THROUGH 9

| | |
|---|---|
| Sulfuric acid (50%) ml | 163.0 |
| Phosphoric acid (50%) ml | 50.0 |
| Surfactant gm | 0.3 |
| Copper sulfate.5H$_2$O[1] gm | 116.1 |
| Hydrogen peroxide (50%) ml | 50.0 |
| Propionic acid (100%) ml | variable |
| Water | to 1 liter |

[1]Copper sulfate added to simulate commercial conditions of use.

The above etchants were used to etch copper from a 1 ounce copper clad epoxy substrate (1.4 mil thick copper) by immersion in the etchant maintained at 120° F. until all of the copper was removed. The amounts of propionic acid used and the results obtained (average of three samples) are set forth in the following table:

| Example No. | Amount (ml) Propionic acid | Time (min.) |
|---|---|---|
| 1. | 0 | 17.7 |
| 2. | 10 | 12.7 |
| 3. | 21 | 9.7 |
| 4. | 31 | 6.7 |
| 5. | 42 | 7.4 |
| 6. | 52 | 6.7 |
| 7. | 62 | 7.1 |
| 8. | 83 | 6.4 |
| 9. | 104 | 8.0 |

EXAMPLES 10 AND 11

| | |
|---|---|
| Sulfuric acid (50%) ml | 163.0 |

| -continued | |
|---|---|
| Phosphoric acid (50%) ml | 50.0 |
| Phenol sulfonic acid gm | 1.0 |
| Copper sulfate.5H$_2$O[1] gm | 75.1 |
| Hydrogen peroxide (50%) ml | 50.0 |
| Propionic acid (100%) ml | variable |
| Water | to 1 liter |

[1] Copper sulfate added to simulate commercial conditions of use. In example 11, the copper sulfate concentration was at 89.9 grams per liter.

The epoxy substrates of examples 1 to 10 were used for these examples, but etching was by spraying at 120° F. rather than by immersion. Without the propionic acid, it took 18.4 minutes to remove the copper. With 53 ml per liter of propionic acid, the etch time was reduced to 3 minutes.

EXAMPLE 12

The procedure of examples 10 and 11 was repeated substituting acetic acid for propionic acid. The acetic used was a 98% solution and added in an amount of 40 ml per liter. With a fresh etchant, the spray time was 20 minutes. After 20 minutes of use, the spray time was 5.5 minutes indicating that an aging process of some sort might be necessary for acetic acid.

A printed circuit board may be prepared from copper clad epoxy substrate using the following sequence of steps:
a. Clean the substrate and drill holes at approilate locations.
b. Metallize the walls of the holes by electroless plating including the steps of catalysis with a catalyst such as catalyst 6F of Shipley Company Inc., accelerate with a mild acid solution and electrolessly plate copper such as with copper mix CP-74 of Shipley Company Inc.
c. Apply a positive working photoresist such as Microposit 1350, expose and develop.
d. Electroplate copper to full desired thickness.
e. Apply immersion tin over the exposed copper.
f. Remove the photoresist by dissolution in a suitable solvent.
g. Remove exposed copper by immersion of the circuit board in the etchant of example 9 until all unwanted copper is dissolved.

I claim:

1. A process for the manufacture of a printed circuit board comprising the step of contacting a copper clad printed circuit board base material, having an etch resist over the surface of the copper defining a circuit pattern, with an etchant for a time sufficient to remove all exposed copper, said etchant comprising an aqueous solution of a peroxide and sulfuric acid, each in an amount sufficient to provide a sustained rate of etching, and propionic acid in an amount sufficient to exalt the etch rate to a rate in excess of that achievable by the peroxide-sulfuric mixture alone.

2. The process of claim 1 where the propionic acid is present in an amount sufficient to double the etch rate relative to said etchant free of the carboxylic acid.

3. The process of claim 1 where the peroxide content varies between about 0.5 and 2.5 moles per liter.

4. The process of claim 1 where the concentration of the propionic acid ranges from about 0.1 to 2.5 moles per liter of solution.

5. A process for dissolving a copper containing metal comprising contact of the copper metal with an etchant that is an aqueous solution of a peroxide and sulfuric acid, each in amounts sufficient to provide a sustained rate of etching of the copper metal, and a low molecular weight carboxylic acid in an amount sufficient to exalt the etch rate to a rate at least double that achievable with the peroxide-sulfuric mixture alone.

6. The process of claim 5 where the copper metal is contacted with the etchant for a time sufficient to dissolve a copper layer having a thickness of at least 0.1 mils.

7. The process of claim 5 where the peroxide content varies between 0.5 and 2.5 moles per liter.

8. The process of claim 6 where the carboxylic acid conforms to the general formula:

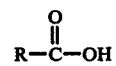

where R is hydrogen or alkyl having from 1 to 6 carbon atoms.

9. The process of claim 8 where the carboxylic acid is propionic acid.

10. The process of claim 5 where the carboxylic acid is present in an amount of from 0.1 to 2.5 moles per liter of solution.

11. The process of claim 6 where the contact of the copper metal is by immersion of the copper metal in a solution of the etchant.

12. The process of claim 6 where the contact of the copper metal is by spraying the etchant onto the surface of the copper metal.

13. A process for the manufacture of a printed circuit board comprising the step of contacting a copper clad printed circuit board base material, having an etch resist over the surface of the copper defining a circuit pattern, with an etchant for a time sufficient to remove all exposed copper, said etchant comprising an aqueous solution of a peroxide and sulfuric acid, each in an amount sufficient to provide a sustained rate of etching, and a low molecular weight carboxylic acid in an amount sufficient to exalt the etch rate to a rate in excess of that achievable by the peroxide-sulfuric mixture alone.

14. The process of claim 13 where the carboxylic acid is present in an amount sufficient to double the etch rate relative to said etchant free of the carboxylic acid.

15. The process of claim 13 where the peroxide content varies between about 0.5 and 2.5 moles per liter.

16. The process of claim 15 where the carboxylic acid conforms to the general formula:

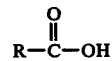

where R is hydrogen or alkyl having from 1 to 6 carbon atoms.

17. The process of claim 16 where the carboxylic acid is propionic acid.

18. The process of claim 13 where the concentration of the carboxylic acid ranges from about 0.1 to 2.5 moles per liter of solution.

19. The process of claim 13 where the etch resist is solder or immersion tin.

20. The process of claim 19 where the etchant contains a solution soluble phosphate.

21. The process of claim 13 where the contact of the printed circuit board base material is by immersion in a solution of the etchant.

22. The process of claim 13 where the contact of the circuit board base material is by spraying the etchant onto the surface of the printed circuit board base material.

23. A process for exalting the etch rate of a hydrogen peroxide-sulfuric acid etchant, said process comprising adding a low molecular weight carboxylic acid to the etchant in a concentration sufficient to double the etch rate compared to an etchant free of the carboxylic acid.

24. The process of claim 23 where the peroxide content varies between 0.5 and 2.5 moles per liter.

25. The process of claim 23 where the carboxylic acid conforms to the general formula

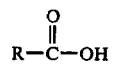

where R is hydrogen or alkyl having from 1 to 6 carbon atoms.

26. The process of claim 25 where the carboxylic acid is propionic acid.

27. The process of claim 26 where the carboxylic acid is present in an amount of from 0.1 to 2.5 moles per liter of solution.